(12) United States Patent
Völkl et al.

(10) Patent No.: US 11,715,815 B2
(45) Date of Patent: Aug. 1, 2023

(54) OPTOELECTRONIC SEMICONDUCTOR DEVICE COMPRISING A FIRST AND A SECOND CURRENT SPREADING STRUCTURE

(71) Applicant: Osram OLED GmbH, Regensburg (DE)

(72) Inventors: Michael Völkl, Regensburg (DE); Siegfried Herrmann, Neukirchen (DE)

(73) Assignee: OSRAM OLED GMBH, Regensburg (DE)

(*) Notice: Subject to any disclaimer, the term of this patent is extended or adjusted under 35 U.S.C. 154(b) by 380 days.

(21) Appl. No.: 17/053,800

(22) PCT Filed: May 8, 2019

(86) PCT No.: PCT/EP2019/061792
§ 371 (c)(1),
(2) Date: Nov. 9, 2020

(87) PCT Pub. No.: WO2019/215212
PCT Pub. Date: Nov. 14, 2019

(65) Prior Publication Data
US 2021/0242367 A1   Aug. 5, 2021

(30) Foreign Application Priority Data
May 9, 2018  (DE) ..................... 10 2018 111 168.1

(51) Int. Cl.
*H01L 33/14* (2010.01)
*H01L 33/10* (2010.01)
*H01L 33/50* (2010.01)

(52) U.S. Cl.
CPC .............. *H01L 33/14* (2013.01); *H01L 33/10* (2013.01); *H01L 33/502* (2013.01)

(58) Field of Classification Search
CPC ...................................................... H01L 33/00
See application file for complete search history.

(56) References Cited

U.S. PATENT DOCUMENTS

| 2012/0161176 A1 | 6/2012 | Heo et al. |
| 2012/0175588 A1 | 7/2012 | Qiao et al. |

(Continued)

FOREIGN PATENT DOCUMENTS

| DE | 202011110910 U1 | 3/2017 |
| DE | 102015117198 A1 | 4/2017 |
| DE | 102016119539 A1 | 4/2018 |

*Primary Examiner* — Robert G Bachner
*Assistant Examiner* — Molly K Reida
(74) *Attorney, Agent, or Firm* — Viering, Jentschura & Partner mbB

(57) ABSTRACT

An optoelectronic semiconductor device may include a first semiconductor layer, a second semiconductor layer, first and second current spreading structures, and an insulating intermediate layer. The second semiconductor layer may be arranged over a substrate. The first semiconductor layer may be arranged between the second semiconductor layer and the substrate. The first current spreading structure may be electrically connected to the first semiconductor layer, and the second current spreading structure electrically may be connected to the second semiconductor layer. The insulating intermediate layer may include a dielectric mirror and may be arranged between the second current spreading structure and the second semiconductor layer. The current spreading structures may overlap one another in a plane perpendicular to a main surface of the substrate. The first current spreading structure may be arranged at a larger distance from the first semiconductor layer than the second current spreading structure.

18 Claims, 8 Drawing Sheets

(56) References Cited

U.S. PATENT DOCUMENTS

| | | |
|---|---|---|
| 2012/0261695 A1 | 10/2012 | Chen et al. |
| 2013/0264600 A1 | 10/2013 | Lee et al. |
| 2015/0179873 A1 | 6/2015 | Wunderer et al. |
| 2015/0236210 A1 | 8/2015 | Kim et al. |
| 2018/0248083 A1 | 8/2018 | Hoeppel et al. |
| 2019/0165215 A1* | 5/2019 | Pfeuffer ................ H01L 33/382 |

* cited by examiner

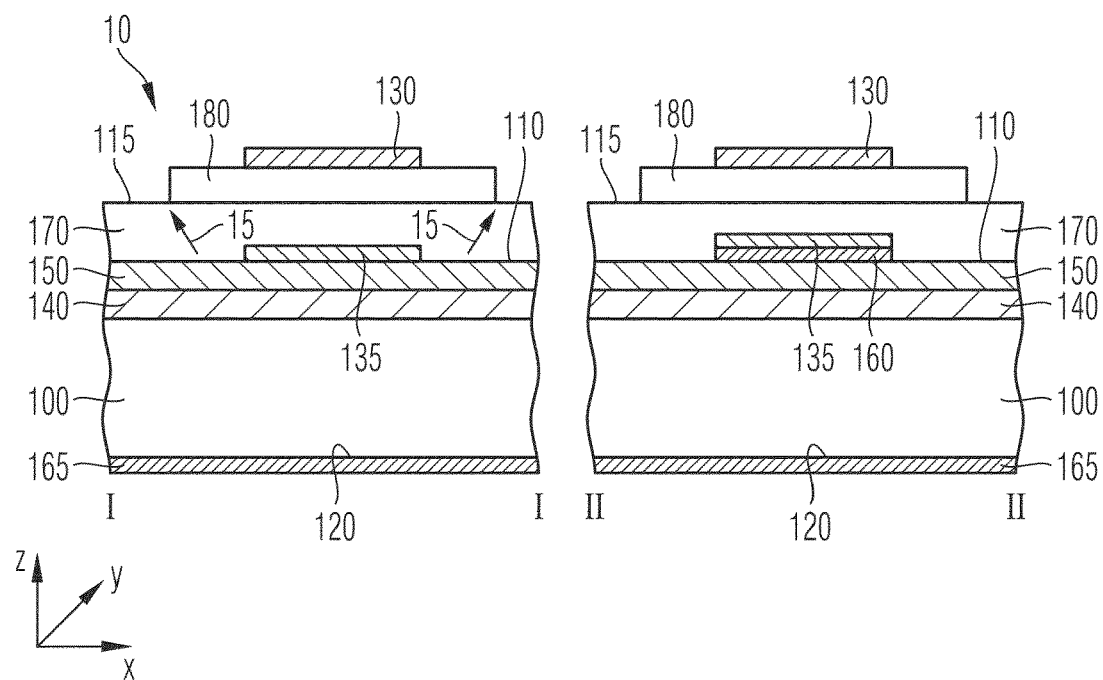
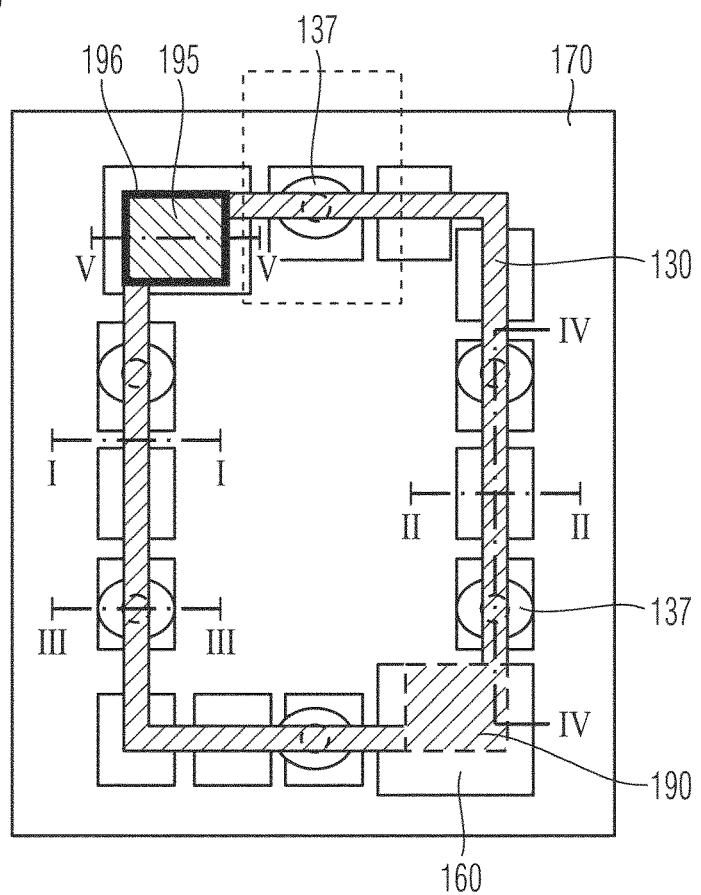

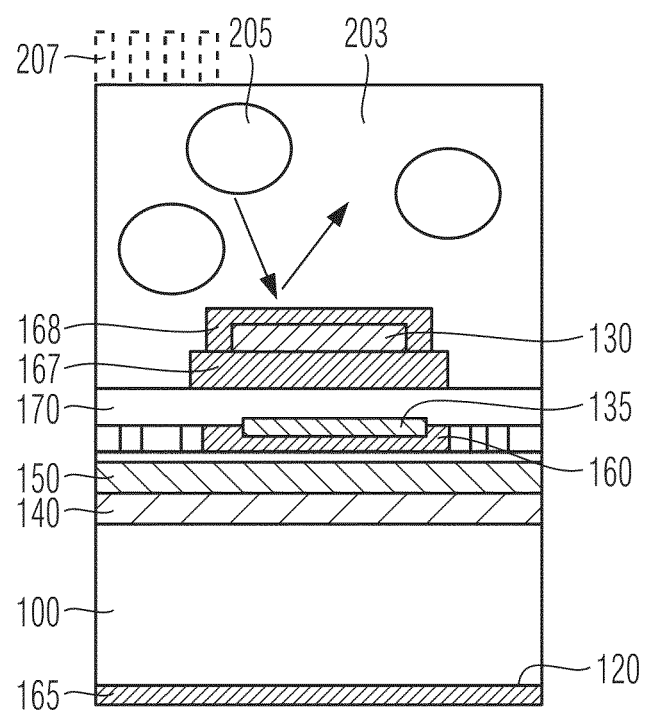

OPTOELECTRONIC SEMICONDUCTOR DEVICE COMPRISING A FIRST AND A SECOND CURRENT SPREADING STRUCTURE

CROSS-REFERENCE TO RELATED APPLICATIONS

The present application is a national stage entry according to 35 U.S.C. § 371 of PCT application No.: PCT/EP2019/061792 filed on May 8, 2019; which claims priority to German Patent Application Serial No.: 10 2018 111 168.1 filed on May 9, 2018; all of which are incorporated herein by reference in their entirety and for all purposes.

TECHNICAL FIELD

An optoelectronic semiconductor device having a first current spreading structure and a second current spreading structure is disclosed.

BACKGROUND

A light emitting diode (LED) is a light emitting device based on semiconductor materials. Usually, an LED comprises a pn junction. When electrons and holes recombine with one another in the area of the pn junction, for example, because a corresponding voltage is applied, electromagnetic radiation is generated.

In general, new concepts are sought with which the semiconductor layers may be electrically contacted uniformly by contact structures, without them impairing the efficiency of the optoelectronic semiconductor device.

The object is achieved by the subject matter of the independent claims. Advantageous further developments are defined in the dependent claims.

SUMMARY

An optoelectronic semiconductor device comprises a first semiconductor layer of a first conductivity type and a second semiconductor layer of a second conductivity type, which are arranged over a substrate, the first semiconductor layer being arranged between the second semiconductor layer and the substrate. The optoelectronic semiconductor device further comprises a first current spreading structure which is electrically connected to the first semiconductor layer, and a second current spreading structure which is electrically connected to the second semiconductor layer. The first current spreading structure is arranged at a greater distance from the first semiconductor layer than the second current spreading structure.

The optoelectronic semiconductor device may further comprise an insulating intermediate layer, which is arranged between the second current spreading structure and the second semiconductor layer. For example, the insulating intermediate layer may be interrupted in sections. As a result, a direct physical contact may be made possible in sections between the second current spreading structure and the second semiconductor layer.

The insulating intermediate layer may comprise any insulating material. According to embodiments, it may also be designed as a dielectric mirror layer. For example, the first dielectric mirror layer may be arranged in direct contact with the second current spreading structure.

For example, the first current spreading structure may be connected to the first semiconductor layer via contact elements. The contact elements may penetrate the second current spreading structure. The optoelectronic semiconductor device may further comprise a vertical dielectric mirror layer, which is arranged on the side walls of the contact elements.

The optoelectronic semiconductor device may further comprise a first transparent conductive layer in an area outside the current spreading structure. The first transparent conductive layer may be arranged in a plane between the first and the second current spreading structures.

The optoelectronic semiconductor device may further comprise a second transparent conductive layer which is arranged between the second semiconductor layer and the first transparent conductive layer, as well as an insulating intermediate layer which is arranged between the first transparent conductive layer and the second transparent conductive layer.

According to further embodiments, the optoelectronic semiconductor device further comprises a second dielectric mirror layer, which is arranged between the first and the second current spreading structures. For example, the second dielectric mirror layer is arranged in direct contact with the first current spreading structure. The optoelectronic semiconductor device may further comprise a third dielectric mirror layer, which is arranged over the first current spreading structure.

For example, the optoelectronic semiconductor device may further comprise an insulating layer between the first and the second current spreading structures, the insulating layer comprising a converter material. For example, the converter material may comprise quantum dots, quantum wells or quantum wires. For example, the mobility of charge carriers may, in the case of quantum wells, be restricted in one direction. In the case of quantum wires, the mobility of the charge carriers may be restricted in two directions, and, in the case of quantum dots, the mobility of the charge carriers may be restricted in three directions. According to embodiments, the converter material may comprise an epitaxially grown semiconductor layer.

The optoelectronic semiconductor device may further comprise a nanostructured outcoupling layer which is arranged over the second semiconductor layer.

According to embodiments, the first and the second current spreading structures may overlap one another in a plane perpendicular to a main surface of the substrate. The optoelectronic semiconductor device may further comprise a first contact region in contact with the first current spreading structure and a second contact region in contact with the second current spreading structure. The first contact region and the second contact region may protrude from a surface of the optoelectronic semiconductor device.

An optoelectronic device comprises the described optoelectronic semiconductor device and a carrier. The optoelectronic semiconductor device is connected to the carrier in such a manner that the second semiconductor layer is at a shorter distance from the carrier than the first semiconductor layer.

BRIEF DESCRIPTION OF THE DRAWINGS

The accompanying drawings serve to provide an understanding of non-limiting embodiments. The drawings illustrate non-limiting embodiments and, together with the description, serve to explain them. Further non-limiting embodiments and numerous of the intended advantages emerge directly from the following detailed description. The elements and structures shown in the drawings are not FIG. 1A shows a schematic cross-sectional view through a portion of an optoelectronic semiconductor device according to embodiments.

FIG. 1B shows a schematic plan view of selected portions of an optoelectronic semiconductor device.

FIGS. 1C to 1E show vertical cross-sectional views through portions of optoelectronic semiconductor devices.

FIG. 3C shows a vertical cross-sectional view of an optoelectronic semiconductor device according to further embodiments.

DETAILED DESCRIPTION

Figure 1D:
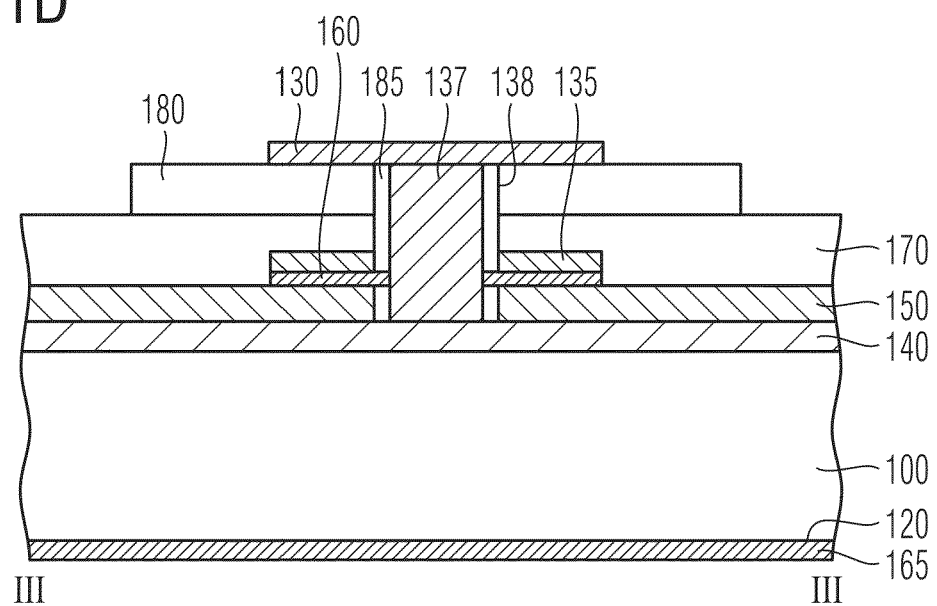

In the following detailed description, reference is made to the accompanying drawings, which form part of the disclosure, and in which specific exemplary embodiments are shown for purposes of illustration. In this context, directional terminology such as "top", "bottom", "front", "back", "over", "on", "in front of", "behind", "trailing", "leading", etc. is used related to the orientation of the aforedescribed figures. Since the components of the exemplary embodiments may be positioned in different orientations, the directional terminology is only used for explanation and is not restrictive in any way.

The description of the exemplary embodiments is not restrictive, since also other exemplary embodiments exist and structural or logical changes may be made without deviating from the scope defined by the claims. In particular, elements of exemplary embodiments described in the following text may be combined with elements of other exemplary embodiments described, unless the context indicates otherwise.

Embodiments are described with reference to "schematic plan views". Such schematic plan views are designed in such a manner that they illustrate portions which are important for the understanding of the embodiments, even if they are not present in a single cross-sectional plane of the object shown. It is possible that these portions are not present on the surface of the object shown either. Thus, such schematic plan views do not necessarily represent a horizontal cross-sectional view and also not a plan view, but rather illustrate horizontal positional relationships of the individual components, regardless of their vertical position.

The terms "wafer" and "semiconductor substrate" used in the following description may include any semiconductor-based structure that has a semiconductor surface. The wafer and structure are to be understood to include doped and undoped semiconductors, epitaxial semiconductor layers, possibly supported by a base, and further semiconductor structures. For example, a layer made of a first semiconductor material may be grown on a growth substrate made of a second semiconductor material or of an insulating material, for example, on a sapphire substrate. Depending on the intended use, the semiconductor may be based on a direct or an indirect semiconductor material. Examples of semiconductor materials particularly adapted to generate electromagnetic radiation include, in particular, nitride semiconductor compounds through which, for example, ultraviolet, blue or longer-wave light may be generated, such as GaN, InGaN, AlN, AlGaN, AlGaInN, phosphide semiconductor compounds, through which, for example, green or longer-wave light may be generated, such as GaAsP, AlGaInP, GaP, AlGaP, as well as other semiconductor materials such as AlGaAs, SiC, ZnSe, GaAs, ZnO, $Ga_2O_3$, diamond, hexagonal BN, and combinations of the materials mentioned. The stoichiometric ratio of the ternary compounds may vary. Further examples of semiconductor materials may include silicon, silicon germanium, and germanium. In the context of the present description, the term "semiconductor" also includes organic semiconductor materials.

The terms "lateral" and "horizontal", as used in this description, are intended to describe an orientation or alignment which runs essentially parallel to a first surface of a substrate or semiconductor body. This may, for example, be the surface of a wafer or a die or a chip.

The term "vertical", as used in this description, is intended to describe an orientation which is essentially perpendicular to the first surface of the substrate or semiconductor body.

To the extent that the terms "have", "contain", "comprise", "include" and the like are used herein, they are open-ended terms that indicate the presence of said elements or features, but do not rule out the presence of other elements or features. The indefinite articles and the definite articles include both the plural and the singular, unless the context clearly indicates otherwise.

Within the scope of the present application, the designation "over" in connection with applied layers refers to a distance from a base layer, for example, a substrate on which the individual layers are applied. For example, the feature that a first layer is arranged "over" a second layer means that the first layer is at a greater distance from the base layer than the second layer.

In the context of this description, the term "electrically connected" means a low-resistance electrical connection between the connected elements. The electrically connected elements need not necessarily be directly connected to one another. Additional elements may be arranged between electrically connected elements.

The term "electrically connected" also includes tunnel contacts between the connected elements.

Usually, the wavelength of electromagnetic radiation emitted by an LED chip may be converted using a converter material which comprises a phosphor. For example, white light may be generated by a combination of an LED chip, which emits blue light, and a suitable phosphor. For example, the phosphor may be a yellow phosphor which, when excited by the light from the blue LED chip, is adapted to emit yellow light. The phosphor can, for example, absorb a portion of the electromagnetic radiation emitted by the LED chip. The combination of blue and yellow light is perceived as white light. The color temperature may be changed by adding further phosphors which are adapted to emit light of a further wavelength, for example, a red wavelength. According to further concepts, white light may be generated by a combination that comprises a blue LED chip and a green and a red phosphor. It goes without saying that a converter material may comprise a plurality of different phosphors, each of which emits different wavelengths.

Examples of phosphors are metal oxides, metal halides, metal sulfides, metal nitrides and others. These compounds may, in addition, comprise additives that lead to specific wavelengths being emitted. For example, the additives may include rare earth materials. As an example of a yellow phosphor, YAG:$Ce^{3+}$ (yttrium aluminum garnet ($Y_3Al_5O_{12}$) activated with cerium) or ($Sr_{1.7}Ba_{0.2}Eu_{0.1}$) $SiO_4$ may be used. Further phosphors may be based on $MSiO_4$:$Eu^{2+}$, where M may be Ca, Sr or Ba. By selecting the cations with an appropriate concentration, a desired conversion wavelength may be selected. Many other examples of suitable phosphors are known.

According to applications, the phosphor material, for example, a phosphor powder, may be embedded in a suitable matrix material. For example, the matrix material may include a resin or polymeric composition such as a silicone or an epoxy resin. The size of the phosphor particles can, for example, be in the micrometer or nanometer range.

According to further embodiments, the matrix material may comprise a glass. For example, the converter material may be formed by sintering the glass, for example $SiO_2$, with further additives and phosphor powder, with the formation of a phosphor in the glass (PiG).

According to further embodiments, the phosphor material itself may be sintered to form a ceramic. For example, the ceramic phosphor may have a polycrystalline structure as a result of the sintering process.

According to further embodiments, the phosphor material may be grown by forming a single-crystal phosphor, for example, by using the Czochralski (Cz) method.

According to further embodiments, the phosphor material itself may be a semiconductor material which has a suitable band gap in bulk or in layers for the absorption of the light emitted by the LED and for and of the emission of the desired conversion wavelength. In particular, it may be an epitaxially grown semiconductor material. For example, the epitaxially grown semiconductor material may have a band gap which corresponds to a lower energy than that of the primarily emitted light. Furthermore, several suitable semiconductor layers, each of which emits light of different wavelengths, may be stacked on top of one another. One or more quantum wells or quantum wells, quantum dots or quantum wires may be formed in the semiconductor material.

In general, the term "dielectric mirror layer" includes any arrangement which reflects incident electromagnetic radiation to a large extent (for example >90%) and is non-conductive. For example, a dielectric mirror layer may be formed by a sequence of very thin dielectric layers each with different refraction indices. For example, the layers may alternately have a high refractive index (n>1.7) and a low refractive index (n<1.7) and be implemented as a Bragg reflector. For example, the layer thickness may be λ/4, where λ indicates the wavelength of the light to be reflected in the particular medium. The layer seen from the incident light may have a greater layer thickness, for example, 3λ/4. Due to the minor layer thickness and the difference in the particular refractive indices, the dielectric mirror layer provides high reflectivity and is non-conductive at the same time. The dielectric mirror layer is thus adapted to insulate components of the semiconductor device from one another. A dielectric mirror layer may, for example, have 2 to 50 dielectric layers. A typical layer thickness of the individual layers may be about 30 to 90 nm, for example, about 50 nm. The layer stack may further comprise one or two or more layers which are thicker than about 180 nm, for example, thicker than 200 nm.

FIG. 1A shows a schematic cross-sectional view through a portion of an optoelectronic semiconductor device 10 according to embodiments. The optoelectronic semiconductor device 10 comprises a first semiconductor layer 140 of a first conductivity type, for example, n-type, as well as a second semiconductor layer 150 of a second conductivity type, for example, p-type. The first and the second semiconductor layers are arranged over a substrate 100. In this process, the first semiconductor layer 140 is arranged between the second semiconductor layer 150 and the substrate 100. The optoelectronic semiconductor device further comprises a first current spreading structure 130, which is electrically connected to first semiconductor layer 140. The optoelectronic semiconductor device further comprises a second current spreading structure 135, which is electrically connected to the second semiconductor layer 150. The first current spreading structure 130 is arranged at a greater distance from the substrate than the second current spreading structure 135.

The second current spreading structure is thus arranged between the first current spreading structure 130 and the second semiconductor layer 150. Since the order in which the current spreading structures are arranged is reversed to the order in which the first and second semiconductor layers are arranged, this arrangement is also referred to as an inverted stacked arrangement. The first and the second current spreading structures 130, 135 may, for example, be implemented by a portion of a conductive layer.

For example, the second current spreading structure 135 may be arranged at least in sections in direct contact with the second semiconductor layer 150. "At least in sections" means in this context that, for example, an insulating or dielectric intermediate layer, for example, a dielectric mirror layer 160, may be arranged in sections between the second current spreading structure 135 and the second semiconductor layer 150. In other words, the insulating intermediate layer or dielectric mirror layer 160 may extend along the second current spreading structure 135 and may, for example, be interrupted at regular or irregular intervals. The insulating intermediate layer may, for example, be a dielectric mirror layer 160. However, it may also be any other insulating layer and comprise, for example, silicon dioxide, silicon nitride or a combination of these materials.

A transparent conductive layer 170, for example, made of ITO (indium tin oxide) or of another suitable material, may be provided in order to ensure continuous electrical contact between the second current spreading structure 135 and the second semiconductor layer 150. In the areas in which the second current spreading structure 135 does not directly adjoin the second semiconductor layer 150, an electrical contact is effected between the second current spreading structure 135 and the second semiconductor layer 150 via the transparent conductive layer 170. Due to the high electrical conductivity of the transparent conductive layer 170, a homogeneous current spreading and, as a result, a homogeneous luminance distribution is achieved. An insulator layer 180 may, for example, be arranged between the transparent conductive layer 170 and the first current spreading structure 130.

The first semiconductor layer 140 may, for example, be arranged over a transparent substrate 100, for example, a sapphire substrate. A dielectric mirror layer 165 may be provided adjacent to a second main surface 120 of the substrate 100. Generated electromagnetic radiation, which is radiated in the direction of the second main surface 120, is reflected by this dielectric mirror layer. Instead of the dielectric mirror layer 165, a reflective layer realized in another way may also be provided.

For example, an active region (not shown in FIG. 1A) may be arranged between the first and second semiconductor layers 140, 150. The active region may, for example, comprise a pn junction, a double heterostructure, a single quantum well (SQW) or a multi quantum well structure (MQW) for the generation of radiation. In this process, the term "quantum well structure" has no meaning with regard to the dimensionality of the quantization. Thus, it includes, among other things, quantum wells, quantum wires and quantum dots, as well as any combination of these layers. Electromagnetic radiation 15 emitted by the optoelectronic semiconductor device 10 is, for example, output via a first main surface 115 of the optoelectronic semiconductor device. Furthermore, emitted electromagnetic radiation may be output via side surfaces of the optoelectronic semiconductor device.

Due to the fact that the first current spreading structure 130 is arranged at a greater distance from the substrate than the second current spreading structure 135, and is also arranged at a greater distance from the first semiconductor layer 140 than the second current spreading structure 135, an optoelectronic semiconductor device may be realized where more active area is available. For example, the first and second current spreading structures 130, 135 may be arranged in such a manner that they overlap. For example, the first current spreading structure 130 may be arranged in such a horizontal position, i.e. a range of x values, which at least partially corresponds to a horizontal position, i.e. a range of x values, of the second electrical contact structure 135. As a result, shading effects may be reduced by the electrical contact structures, as a result of which more active semiconductor area is available for emitting electromagnetic radiation. The first and the second current spreading structures 130, 135 may, for example, comprise one or more conductive materials, for example, gold. The first and the second semiconductor layers may comprise, for example, any of the aforementioned semiconductor materials. For example, they may comprise GaN or a GaN-comprising compound semiconductor.

FIG. 1B shows a schematic plan view of selected portions of the optoelectronic device illustrated in FIG. 1A. As illustrated in FIG. 1B, the cross-sectional view of FIG. 1A is taken between I and I. The cross-sectional views of FIGS. 1C, 1D and 1E described below are taken between II and II, between III and III, as well as between IV and IV, respectively. A first current spreading structure 130 is, for example, designed linear and encloses a semiconductor area, which is covered by a transparent insulating layer 170, in the shape of an arc or rectangle. A dielectric mirror layer 160 is arranged between the first current spreading structure 130 and the semiconductor layer (not shown) below it. The dielectric mirror layer 160 is interrupted in sections, so that the second current spreading structure 135 contacts the second semiconductor layer 150 directly in the areas that are positioned between the sections of the dielectric mirror layer 160. The first current spreading structure 130 and the second current spreading structure 135 overlap horizontally. That is, there is a horizontal range of x values in which both the first current spreading structure 130 and the second current spreading structure 135 exist. The first current spreading structure 130 is connected in sections to the first semiconductor layer 140 via electrical contact elements 137. The first current spreading structure 130 may be contacted via a first contact region 190. The second current spreading structure 135 may also be contacted by a second contact region 195. The first and second contact regions 195, 190 are arranged in the area of a first main surface 115 of the optoelectronic semiconductor device 10. The second contact region 195 is, for example, insulated from the first current spreading structure 130 via a sidewall isolation 196.

FIG. 1C shows a vertical cross-sectional view of the semiconductor device between II and II, in a region which intersects the dielectric mirror layer 160. In contrast, the cross-sectional view of FIG. 1A is taken between I and I, at a point at which the dielectric mirror layer 160 is interrupted. As may be seen, the dielectric mirror layer 160 is arranged between the second semiconductor layer 150 and the second current spreading structure 135. The second current spreading structure 135 is connected to the second semiconductor layer 150 in this area via the transparent conductive layer 170. The dielectric mirror layer has a layer thickness of about 60 to 500 nm. For example, the dielectric mirror layer 160 is arranged in direct contact with the second current spreading structure 135.

The fact that a dielectric mirror layer 160 is arranged between the second semiconductor layer 150 and the second contact structure 135 may prevent electromagnetic radiation emitted by the active region from being absorbed by the second current spreading structure 135. According to embodiments, the light emitted by the optoelectronic semiconductor device may be blue, and the current spreading structures may each comprise gold, which is adapted to absorb blue light. In this case, the dielectric mirror layer 160 may prevent the emitted light from being absorbed.

For example, a portion of the transparent conductive layer 170 may be arranged in an area outside the first and second current spreading structures 130, 135. Furthermore, a portion of the transparent conductive layer 170 may be arranged between the first and second current spreading structures.

FIG. 1D shows a vertical cross-sectional view through the optoelectronic semiconductor device between III and III, at a position which intersects the electrical contact elements 137. According to embodiments, electrical contact elements 137 may be provided in order to connect the first current spreading structure to the first semiconductor layer 140. For example, the contact element 137 may be arranged in a contact opening 138. In particular, the contact opening 138 may penetrate the second semiconductor layer 150 and the first current spreading structure 135. An insulating layer 185 may be applied to the side wall of the contact opening 138 in order to insulate the electroconductive element of the contact element 137 from the adjacent conductive and semiconductor layers. For example, the insulating layer 185 may be implemented as a dielectric mirror layer. For example, the material of the contact element 137 may be the material of the first current spreading structure 130. As illustrated in FIG. 1B, the contact elements 137 are arranged at certain intervals along the first current spreading structure 130. A cross section of the contact opening 138 may, for example, be round, oval or also angular.

Due to the fact that the contact elements, as illustrated in FIG. 1D, extend from the first current spreading structure 130 through the second current spreading structure 135 and the second semiconductor layer 150, the contact elements 137 may be arranged in a particularly space-saving manner. As a result, the semiconductor layers may be efficiently contacted and, at the same time, a large proportion of the active area of the semiconductor device may be used to generate electromagnetic radiation.

Figure 1E:
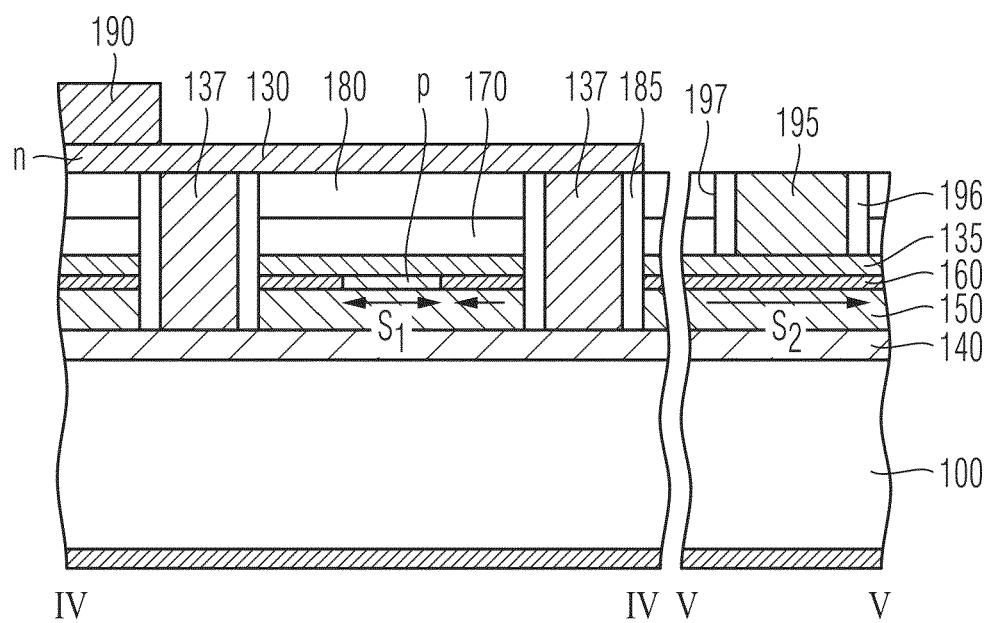

FIG. 1E shows a vertical cross-sectional view along the first and the second electrical contact structures 130, 135. There are two contact elements 137 in this area, which connect the first current spreading structure 130 to the first semiconductor layer 140. Furthermore, the dielectric mirror layer 160 is interrupted in places, so that the second current spreading structure 135 contacts the second semiconductor layer 150 directly at these places. As may further be seen, the ratio of contact area S1 between the second contact structure 135 and the second semiconductor layer 150 to S2, i.e. the length of the second current spreading structure 135, on which the dielectric mirror layer 160 is arranged between the second electrical contact structure 135 and the second semiconductor layer 150, is significantly less than 1. Correspondingly, absorption of electromagnetic radiation may be reduced by the second current spreading structure 135 and adjusted by adjusting the ratio of S1 to S2.

As may further be seen in FIG. 1E, the first current spreading structure 130 may be contacted via a first contact region 190. Furthermore, the second current spreading structure 135 may be contacted via the second contact region 195. For example, the second contact region 195 is arranged in a contact opening 197 which is formed in the conductive transparent layer 170 and the insulator layer 180. Furthermore, the second contact region may be insulated from adjacent conductive layers via a sidewall isolation 196. For example, this sidewall isolation 196 may comprise a dielectric mirror layer.

Figure 2A:
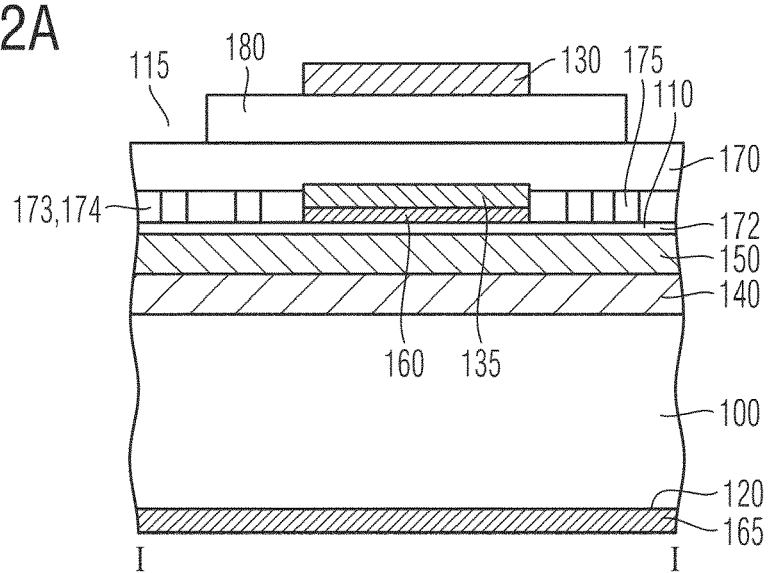
FIG. 2A shows a vertical cross-sectional view through a portion of an optoelectronic semiconductor device according to further embodiments.
Figure 2B:
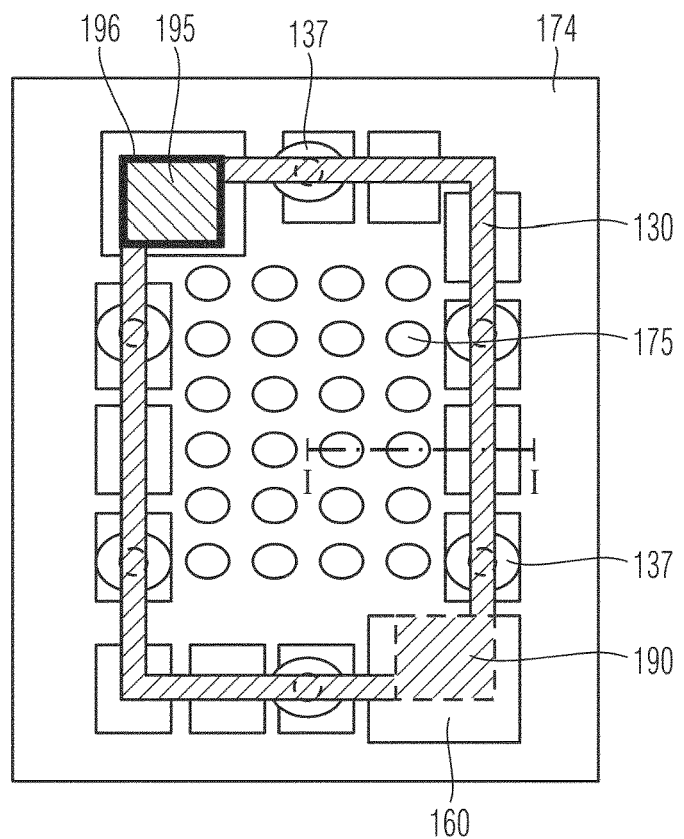
FIG. 2B shows a schematic plan view of selected portions of an optoelectronic semiconductor device according to embodiments.

FIG. 2A shows a vertical cross-sectional view of an optoelectronic semiconductor device according to further embodiments between I and I, as illustrated in FIG. 2B. According to the embodiments illustrated in FIG. 2A, the optoelectronic semiconductor device comprises a first transparent conductive layer 170, which is arranged in a plane between the second current spreading structure 135 and the first current spreading structure 130. In addition, a second transparent conductive layer 172 is arranged between the second semiconductor layer 150 and the second current spreading structure 135. For example, the second transparent conductive layer 172 may be arranged in contact with the second semiconductor layer 150 and cover it extensively. An insulating intermediate layer 173, 174 may be arranged between the first and the second transparent conductive layers 170, 172. For example, a large number of connecting elements 175 may be provided in order to electrically connect the first transparent conductive layer 170 to the second transparent conductive layer 172. A dielectric mirror layer 160 may be arranged between the second current spreading structure 135 and the second transparent conductive layer 172. According to embodiments, the dielectric mirror layer 160 may be interrupted in sections. In this arrangement, the proportion of the electromagnetic radiation emitted towards the first main upper surface 115 of the optoelectronic device may be further increased, as is described in the following text with reference to FIG. 2C.

FIG. 2B shows a schematic plan view of portions of the optoelectronic device. In addition to the elements illustrated in FIG. 1B, the optoelectronic device has a large number of connecting elements 175 which electrically connect the first transparent conductive layer 170 to the second transparent conductive layer 172. Furthermore, an insulating intermediate layer 173, 174, for example, an angle filtering layer, is arranged between the first and the second transparent conductive layers 170, 172.

Figure 2C:
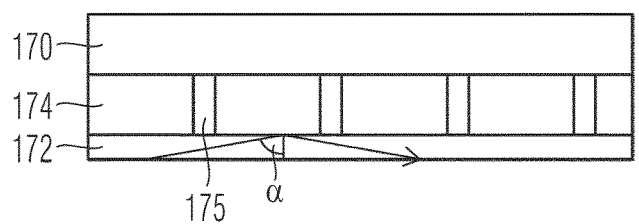
FIG. 2C shows an enlarged cross-sectional view of a portion of the cross-sectional view illustrated in FIG. 2A.

FIG. 2C shows a cross-sectional view of a portion of the optoelectronic device to illustrate the effect of an angle filtering layer 174, which represents the insulating intermediate layer 173. If emitted electromagnetic radiation occurs at the interface between the second transparent conductive layer 172 and the angle filtering layer 174 at a flat angle α, for example, an angle α>45°, related to a surface normal, then this electromagnetic radiation is already reflected at the interface between the second transparent conductive layer 172 and the angle filtering layer 174. The angle filtering layer is permeable at non-flat angles, for example, angles α<45° related to the surface normal. In devices without an angle filtering layer 174 or a comparable layer, it is possible that this radiation is only reflected at the interface between the first transparent conductive layer 170 and air. This reflected radiation may then, in turn, pass through the entire first transparent conductive layer 170, before it is reflected in the direction of the first main surface 115 of the optoelectronic device. Losses caused by reflection may be reduced by the angle filtering layer.

According to further embodiments, the insulating intermediate layer 173 may be designed in such a manner that it does not have a smooth surface, but a structured, for example, a roughened surface. More precisely, in this case the interface between the insulating intermediate layer 173 and the adjacent first transparent conductive layer 170 is roughened. As a result, the emission angles of the emitted electromagnetic radiation are distributed randomly, whereby the risk of total reflection when exiting the optoelectronic semiconductor device is reduced. As a result, losses of the generated electromagnetic radiation may be reduced.

Figure 3A:
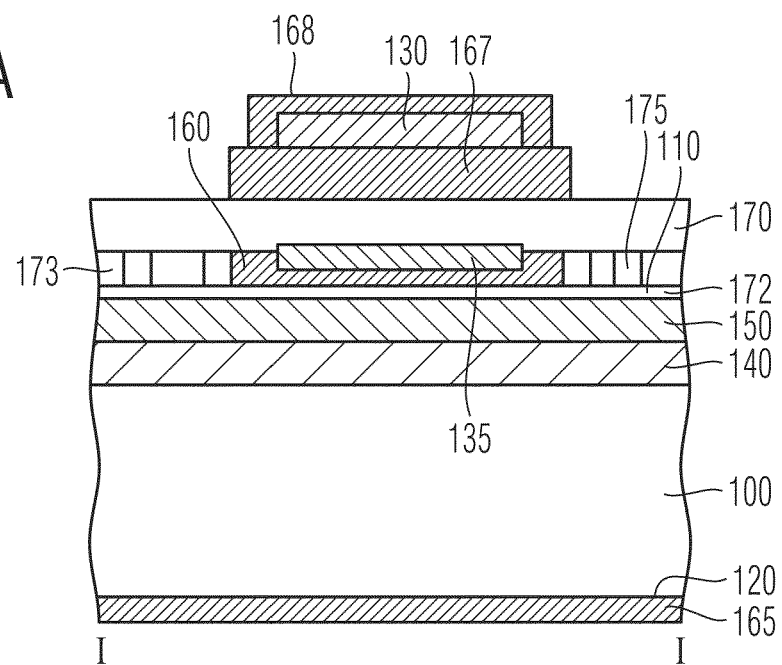
FIG. 3A shows a vertical cross-sectional view of a portion of an optoelectronic semiconductor device according to embodiments.

FIG. 3A shows a cross-sectional view through a portion of an optoelectronic semiconductor device according to further embodiments. In addition to the elements illustrated in FIG. 2A, the optoelectronic device comprises a second dielectric mirror layer 167, which is arranged between the first and the second current spreading structures 130, 135.

For example, the second dielectric mirror layer 167 is arranged in direct contact with the first current spreading structure 130. In addition, the optoelectronic semiconductor device may comprise a third dielectric mirror layer 168, which is arranged over the first current spreading structure. For example, the second dielectric mirror layer 168 is arranged on the side walls of the first current spreading structure and on the surface of the first current spreading structure 130 facing away from the second current spreading structure 135. According to embodiments, the first current spreading structure 130 is completely encapsulated by the second and third dielectric mirror layers 167, 168. This design of the first current spreading structure 130, which is at least partially surrounded by the dielectric mirror structure 167, 168, may be combined with all conceivable embodiments. As a result of this arrangement, the absorption of the electromagnetic radiation may be further reduced by the first current spreading structure 130.

Figure 3B:
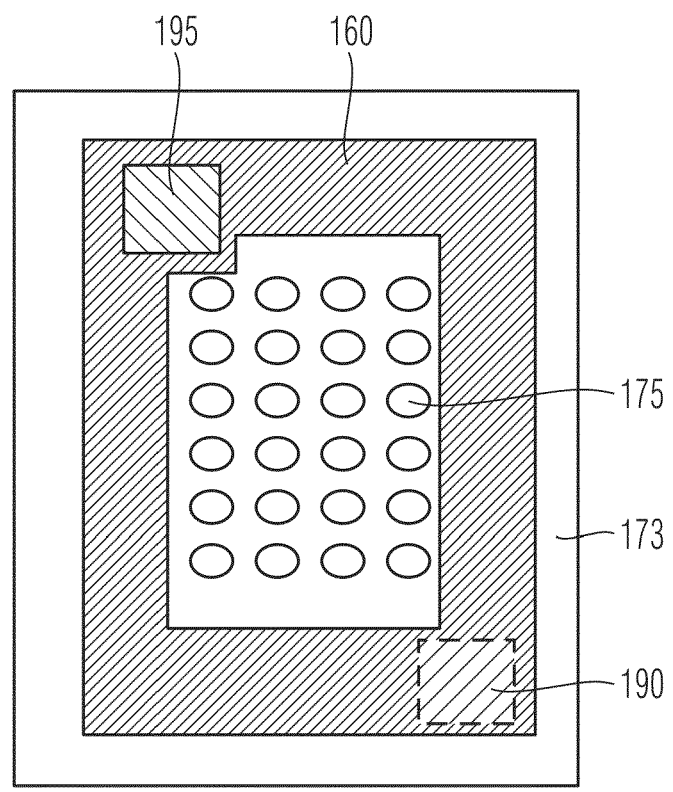
FIG. 3B shows a schematic plan view of selected portions of an optoelectronic semiconductor device according to embodiments.

FIG. 3B shows a schematic plan view of portions of the optoelectronic device according to further embodiments. According to these embodiments, the dielectric mirror layer 160 is, in contrast to the embodiments illustrated in FIGS. 1A to 1E, not interrupted in sections, but designed continuously. This means that it is possible that the second current spreading structure 135, for example, does not directly contact the second semiconductor layer 150 or the second transparent conductive layer 172 arranged over the second semiconductor layer. In this case, an electrical contact between the second current spreading structure 135 and the second semiconductor layer 150 is ensured via the first transparent conductive layer 170 and, if applicable, the connecting elements 175 and the second transparent conductive layer 172. Due to the fact that, according to embodiments, the electrical contact is effected via the first transparent conductive layer 170, a more homogeneous current spreading is made possible and, as a result, a more homogeneous luminance is generated. In FIG. 3B, positions of the first contact region 190 and of the second contact region 195 are also indicated. The first contact region 190 makes contact with the first current spreading structure 130 in a plane above the dielectric mirror layer 160.

FIG. 3C shows a schematic plan view of portions of a semiconductor device according to further embodiments. In addition to the elements illustrated in FIG. 3A, an insulating layer 203 may, for example, be arranged over a surface of the first transparent conductive layer 170, as well as over the first current spreading structure 130. According to embodiments, the first current spreading structure 130 may be completely encapsulated by dielectric mirror layers 167, 168. For example, the insulating layer 203 may comprise a polymer or resin, for example, a silicone resin. Furthermore, a converter material 205 may be arranged in the insulating layer 203. If the first current spreading structure 130 is covered with the dielectric mirror layer 168, the converted or scattered light may be reflected to a larger extent, which leads to an improvement of the optoelectronic device.

According to embodiments, the converter material may comprise quantum dots or an optically pumped nano-column converter or quantum wires. For example, the converter material may comprise a suitable semiconductor material, for example, an epitaxially grown semiconductor material.

The optoelectronic semiconductor device may further comprise a nanostructured outcoupling layer 207, which may, for example, be arranged over the converter material or over the first transparent conductive layer 170. For example, the nanostructured outcoupling layer 207 may be a structured tin oxide layer. For example, the outcoupling layer 207 may be structured into nanopillars with a diameter of less than 50 nm, for example, less than 20 nm, for example, 10 nm and a height of a few 100 nm. As a result, the outcoupling efficiency may be further increased.

According to the embodiments described with reference to FIGS. 1A to 1E, the contact elements 137, for example, which connect the first current spreading structure 130 to the first semiconductor layer 140, may be arranged in a central portion of the first current spreading structures 130. According to further embodiments, however, the contact elements 137 may also be arranged laterally on the first current spreading structure 130. For example, the contact elements 137 may be guided laterally past the second current spreading structure 135. For example, the contact opening 138 may be guided laterally past the second current spreading structure 135. As a result, the process management for producing the contact elements may be simplified. At the same time, the space requirement for producing the contact elements 137 is only insignificantly increased. The special design of the contact elements 137, as illustrated in FIG. 4A, may be applied to all of the described embodiments.

Figure 4A:
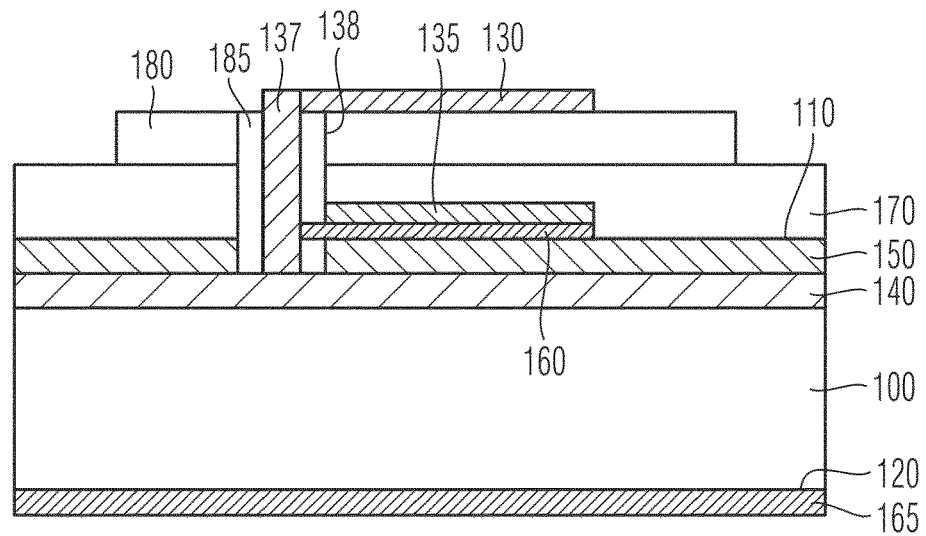
FIG. 4A shows a vertical cross-sectional view of a portion of an optoelectronic semiconductor device according to embodiments.
Figure 4B:
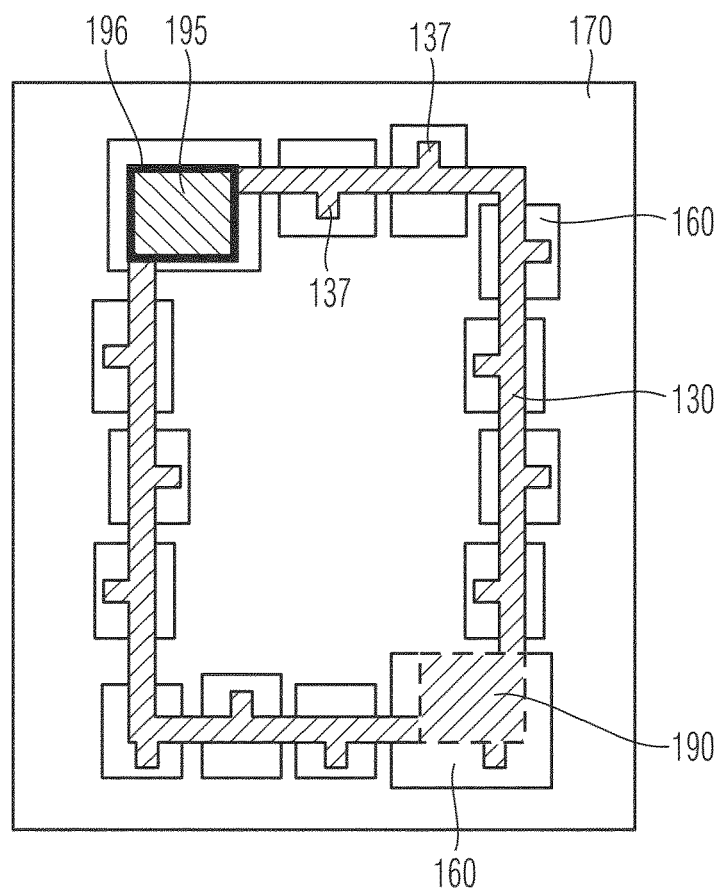
FIG. 4B shows a schematic plan view of selected portions of an optoelectronic semiconductor device according to embodiments.

FIG. 4B shows a schematic horizontal cross-sectional view of the optoelectronic device illustrated in FIG. 4A. As may be seen, the contact elements 137 are, according to FIG. 4B, arranged laterally next to the first current spreading structure 130.

Figure 5:
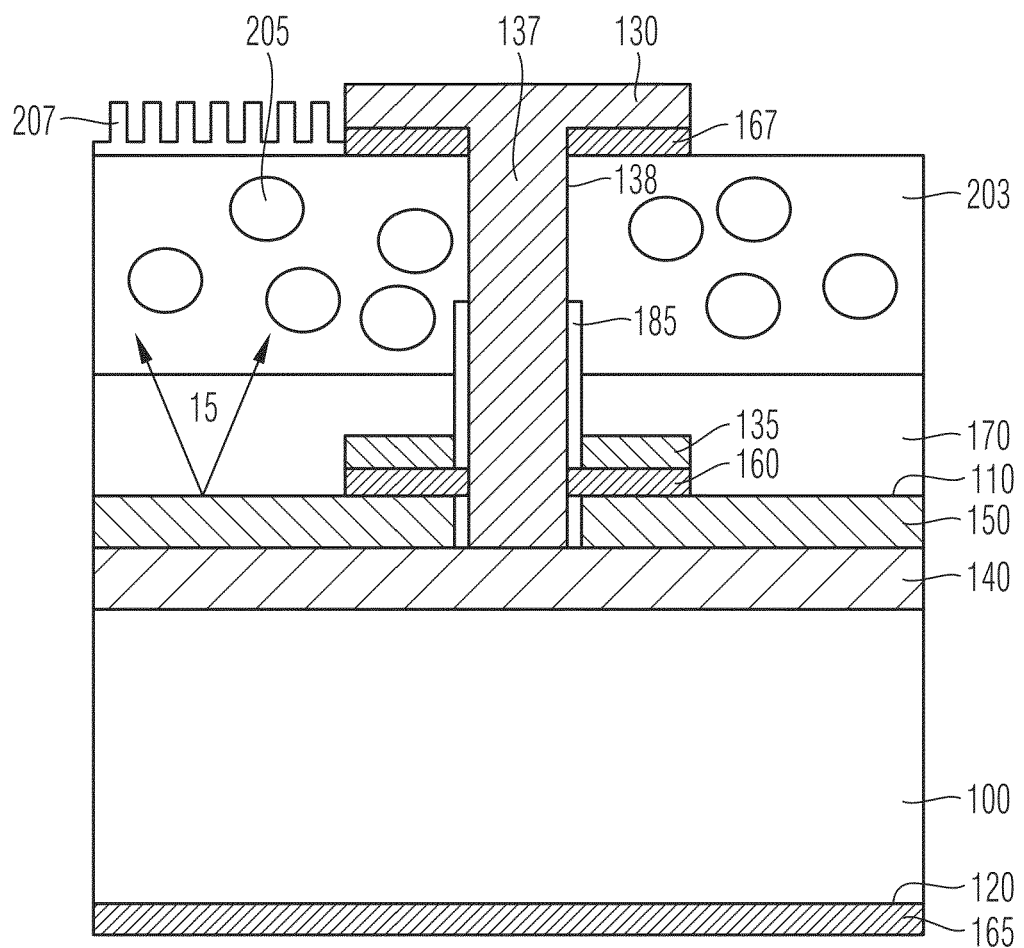
FIG. 5 shows a vertical cross-sectional view of a portion of an optoelectronic semiconductor device according to embodiments.

FIG. 5 shows a vertical cross-sectional view of the optoelectronic device according to further embodiments. In addition to the aforedescribed elements, an insulating layer 203 is arranged between the transparent conductive layer 170 and the first current spreading structure 130. For example, a converter material 205 may be arranged in the insulating layer 203. The insulating layer may, for example, be a polymer or resin layer. A layer thickness of the insulating layer 203 may amount to, for example, 10 to 50 µm, for example, 25 to 35 µm.

For example, the optoelectronic device may be configured in such a manner that the dielectric mirror layer 160 is arranged at least in sections between the second current spreading structure 135 and the second semiconductor layer 150. Furthermore, a second dielectric mirror layer 167 may be arranged on the underside of the first current spreading structure 130, i.e. on the side of the first current spreading structure 130 that faces the second current spreading structure 135. The absorption of the electromagnetic radiation is reduced accordingly by the first current spreading structure 130. The second dielectric mirror layer 167 may be arranged in direct contact with the first current spreading structure 130.

The optoelectronic semiconductor device may further comprise a nanostructured outcoupling layer 207. The nanostructured outcoupling layer 207 may be designed similar to the one described with reference to FIG. 3C.

For example, the optoelectronic semiconductor device may be produced by bonding thin water glass with converter to the resulting surface after the transparent conductive layer 170 has been applied. Subsequently, contact openings 138 are formed in the resulting layer stack. Subsequently, a conductive material is then introduced into the contact openings 138, for example, gold. The dielectric mirror layer 167 and the first current spreading structure 130 are then formed. Due to the fact that the side of the first and second current spreading structures 130, 135 facing the semiconductor layers is each provided with the dielectric mirror layer 160, 167, the absorption of the emitted radiation is further reduced. Similar to optoelectronic semiconductor devices in which a converter is arranged above the first current spreading structure 130, it is also possible in the optoelectronic semiconductor device shown in FIG. 5 to prevent already converted light from being absorbed by the first current spreading structure 130. Due to the fact that the dielectric mirror layer 167 is arranged between the first current spreading structure and the converter element, absorption of the generated electromagnetic radiation may be prevented when the converter element is arranged between the second semiconductor layer 150 and the first contact structure 130.

According to the described embodiments, the converter material may comprise quantum dots or optically pumped nano columns or quantum wires. For example, the converter material may comprise a suitable semiconductor material, for example, an epitaxially grown semiconductor material.

Figure 6:
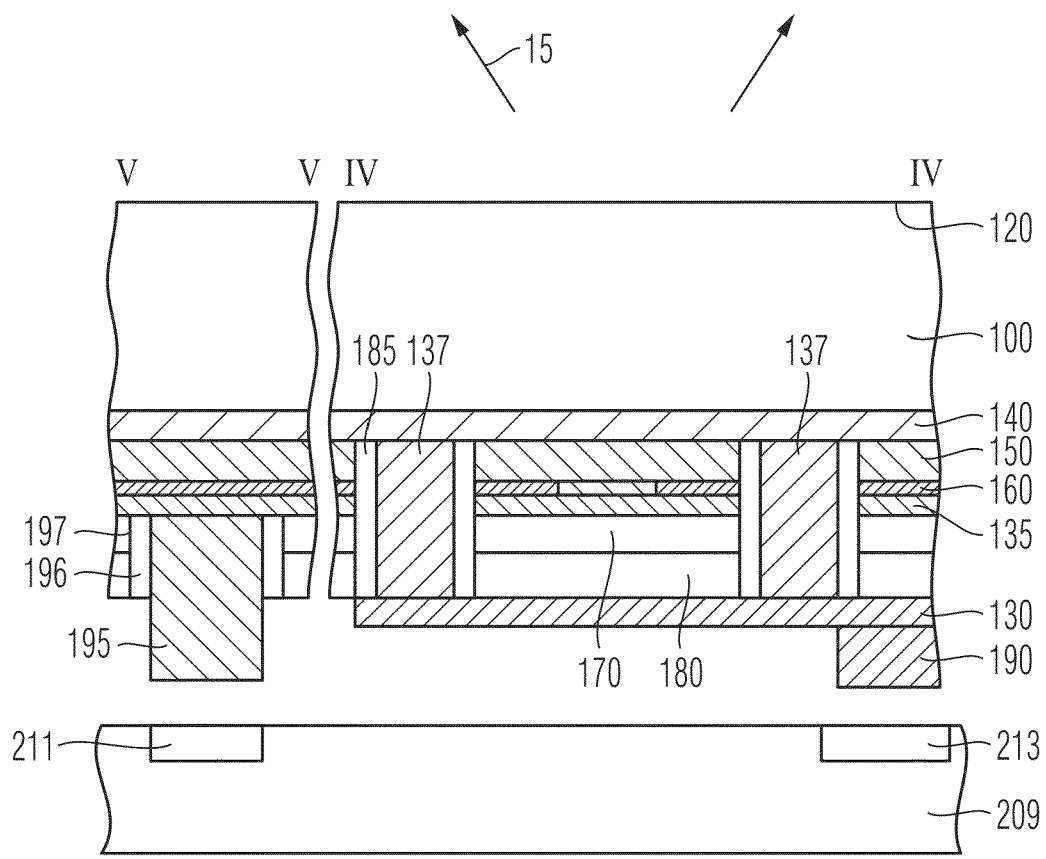
FIG. 6 shows a vertical cross-sectional view of a portion of an optoelectronic semiconductor device according to further embodiments.

FIG. 6 shows an optoelectronic device 20 according to embodiments. As described with reference to FIG. 1A, generated electromagnetic radiation 15 may be emitted via the first main surface 115 of the optoelectronic semiconductor device 10. According to further embodiments, it is also possible that generated electromagnetic radiation 15 is emitted via the second main surface 120 of the transparent substrate 100. For example, the described optoelectronic semiconductor device 10 may be applied to a suitable carrier 209 in such a manner that the first main surface 110 of the semiconductor layer stack faces the carrier 209, while the second main surface 120 of the transparent substrate 100 faces away from the carrier 209. In this case, as illustrated in FIG. 6, no dielectric mirror layer is arranged adjacent to the second main surface 120 of the transparent substrate 100. For example, in this case the first and the second contact regions 190, 195 may be designed in such a manner that they project from a surface of the optoelectronic semiconductor device. For example, the first and the second contact regions 190, 195 may each extend to the same height, so that they may be joined together with the carrier 209. For example, the carrier 209 may comprise a first contact 213 and a second contact 211. The first contact region 190 may be connected to the first contact 213, and the second contact region 195 may be connected to the second contact 211. This results in an optoelectronic device 20 with compact dimensions.

Although specific embodiments have been illustrated and described herein, those skilled in the art will recognize that the specific embodiments shown and described may be replaced by a multitude of alternative and/or equivalent configurations without departing from the scope of the invention. The application is intended to cover any adaptations or variations of the specific embodiments discussed herein. Therefore, the invention is to be limited only by the claims and their equivalents.

LIST OF REFERENCES

10 optoelectronic semiconductor device
15 emitted electromagnetic radiation
20 optoelectronic device
100 sapphire substrate
110 first main surface of the semiconductor layer stack
115 first main surface of the optoelectronic semiconductor device
120 second main surface of the sapphire substrate
130 first current spreading structure
135 second current spreading structure
137 contact element
138 contact opening
140 first semiconductor layer
150 second semiconductor layer
160 first dielectric mirror layer
165 dielectric mirror layer
167 second dielectric mirror layer
168 third dielectric mirror layer
170 first transparent conductive layer
172 second transparent conductive layer
173 insulating intermediate layer
174 angle filtering layer
175 connecting element
180 insulator layer
185 insulating layer
190 first contact region
195 second contact region
196 sidewall isolation
197 contact opening
203 insulating layer
205 converter material
207 outcoupling layer
209 carrier
211 second contact
213 first contact

The invention claimed is:

1. An optoelectronic semiconductor device comprising:
a first semiconductor layer of a first conductivity type;
a second semiconductor layer of a second conductivity type arranged over a substrate;
wherein the first semiconductor layer is arranged between the second semiconductor layer and the substrate;
a first current spreading structure electrically connected to the first semiconductor layer;
a second current spreading structure electrically connected to the second semiconductor layer;
wherein the first current spreading structure is arranged at a larger distance from the first semiconductor layer than the second current spreading structure;
an insulating intermediate layer arranged between the second current spreading structure and the second semiconductor layer; wherein the insulating intermediate layer comprises a dielectric mirror layer, and wherein the first current spreading structure and the second current spreading structure overlap one another in a plane perpendicular to a main surface of the substrate; and
wherein the optoelectronic semiconductor device is configured to emit radiation via a main surface of the optoelectronic semiconductor device facing away from the substrate.

2. The optoelectronic semiconductor device according to claim 1, wherein the insulating intermediate layer is interrupted in sections.

3. The optoelectronic semiconductor device according to claim 1, wherein the first dielectric mirror layer directly contacts the second current spreading structure.

4. The optoelectronic semiconductor device according to claim 1, wherein the first current spreading structure is connected to the first semiconductor layer via contact elements.

5. The optoelectronic semiconductor device according to claim 4, wherein the contact elements penetrate the second current spreading structure.

6. The optoelectronic semiconductor device according to claim 4, further comprising a vertical dielectric mirror layer arranged on the side walls of the contact elements.

7. The optoelectronic semiconductor device according to claim 1, further comprising a first transparent conductive layer in an area outside the first current spreading structure and the second current spreading structure.

8. The optoelectronic semiconductor device according to claim 5, wherein the first transparent conductive layer is arranged in a plane between the first current spreading structure and the second current spreading structure.

9. The optoelectronic semiconductor device according to claim 8, further comprising:
a second transparent conductive layer arranged between the second semiconductor layer and the first transparent conductive layer; and
an insulating intermediate layer arranged between the first transparent conductive layer and the second transparent conductive layer.

10. The optoelectronic semiconductor device according to claim 1, further comprising a second dielectric mirror layer arranged between the first current spreading structure and the second current spreading structure.

11. The optoelectronic semiconductor device according to claim 10, wherein the second dielectric mirror layer directly contacts the first current spreading structure.

12. The optoelectronic semiconductor device according to claim 1, further comprising a third dielectric mirror layer arranged over the first current spreading structure.

13. The optoelectronic semiconductor device according to claim 1, further comprising an insulating layer between the first current spreading structure and the second current spreading structure, the insulating layer comprising a converter material.

14. The optoelectronic semiconductor device according to claim 13, wherein the converter material comprises quantum dots, quantum wells, quantum wires, or combinations thereof.

15. The optoelectronic semiconductor device according to claim 13, wherein the converter material comprises an epitaxially grown semiconductor layer.

16. The optoelectronic semiconductor device according to claim 1, further comprising a nanostructured outcoupling layer over the second semiconductor layer.

17. The optoelectronic semiconductor device according to claim 1, further comprising:
- a first contact region contacting the first current spreading structure; and
- a second contact region contacting the second current spreading structure, wherein the first contact region and the second contact region protrude from a surface of the optoelectronic semiconductor device.

18. An optoelectronic device comprising:
- an optoelectronic semiconductor device according to claim 1; and
- a carrier, wherein the optoelectronic semiconductor device is connected to the carrier in such a manner that the second semiconductor layer is arranged at a shorter distance from the carrier than the first semiconductor layer.

* * * * *